United States Patent
Majumdar et al.

[11] Patent Number: 6,124,083
[45] Date of Patent: *Sep. 26, 2000

[54] ANTISTATIC LAYER WITH ELECTRICALLY CONDUCTING POLYMER FOR IMAGING ELEMENT

[75] Inventors: Debasis Majumdar, Rochester; Dennis J. Eichorst, Fairport; Charles C. Anderson, Penfield; Dennis J. Savage, Rochester, all of N.Y.

[73] Assignee: Eastman Kodak Company, Rochester, N.Y.

[*] Notice: This patent is subject to a terminal disclaimer.

[21] Appl. No.: 09/172,878

[22] Filed: Oct. 15, 1998

[51] Int. Cl.⁷ .................................................... G03C 1/89
[52] U.S. Cl. .......................... 430/529; 430/527; 430/531
[58] Field of Search ........................ 430/527, 529, 430/530, 531, 533, 140

[56] References Cited

U.S. PATENT DOCUMENTS

| | | | |
|---|---|---|---|
| 4,070,189 | 1/1978 | Kelley et al. | 96/87 A |
| 4,275,103 | 6/1981 | Tsubusaki et al. | 428/148 |
| 4,394,441 | 7/1983 | Kawaguchi et al. | 430/524 |
| 4,416,963 | 11/1983 | Takimoto et al. | 430/69 |
| 4,418,141 | 11/1983 | Kawaguchi et al. | 430/530 |
| 4,431,764 | 2/1984 | Yoshizumi | 524/409 |
| 4,442,168 | 4/1984 | White et al. | 428/331 |
| 4,495,276 | 1/1985 | Takimoto et al. | 430/527 |
| 4,571,361 | 2/1986 | Kawaguchi et al. | 428/328 |
| 4,571,365 | 2/1986 | Ashlock et al. | 428/412 |
| 4,731,408 | 3/1988 | Jasne | 524/458 |
| 4,880,703 | 11/1989 | Sakamoto et al. | 428/378 |
| 4,987,042 | 1/1991 | Jonas et al. | 429/213 |
| 4,999,276 | 3/1991 | Kuwabara et al. | 430/264 |
| 5,093,439 | 3/1992 | Epstein et al. | 525/540 |
| 5,122,445 | 6/1992 | Ishigaki | 430/527 |
| 5,204,219 | 4/1993 | Van Ooiji et al. | 430/272 |
| 5,236,818 | 8/1993 | Carlson | 430/527 |
| 5,273,822 | 12/1993 | Hayashi et al. | 428/389 |
| 5,294,525 | 3/1994 | Yamauchi et al. | 430/530 |
| 5,300,575 | 4/1994 | Jonas et al. | 525/186 |
| 5,312,681 | 5/1994 | Muys et al. | 428/341 |
| 5,340,676 | 8/1994 | Anderson et al. | 430/530 |
| 5,350,448 | 9/1994 | Dietz et al. | 106/441 |
| 5,354,613 | 10/1994 | Quintens et al. | 428/341 |
| 5,368,995 | 11/1994 | Christian et al. | 430/530 |
| 5,370,981 | 12/1994 | Krafft et al. | 430/529 |
| 5,372,924 | 12/1994 | Quintens et al. | 430/527 |
| 5,382,494 | 1/1995 | Kudo et al. | 430/140 |
| 5,391,472 | 2/1995 | Muys et al. | 430/527 |
| 5,403,467 | 4/1995 | Jonas et al. | 528/186 |
| 5,443,944 | 8/1995 | Krafft et al. | 430/529 |
| 5,459,021 | 10/1995 | Ito et al. | 430/527 |
| 5,466,567 | 11/1995 | Anderson et al. | 430/53 |
| 5,484,694 | 1/1996 | Lelental et al. | 430/530 |
| 5,575,898 | 11/1996 | Wolf et al. | 205/125 |
| 5,585,037 | 12/1996 | Linton | 252/518 |
| 5,628,932 | 5/1997 | Linton | 252/518 |
| 5,665,498 | 9/1997 | Savage et al. | 430/529 |
| 5,674,654 | 10/1997 | Zumbulyadis et al. | 430/41 |
| 5,679,505 | 10/1997 | Tingler et al. | 430/523 |
| 5,695,920 | 12/1997 | Anderson et al. | 430/531 |
| 5,700,623 | 12/1997 | Anderson et al. | 430/256 |
| 5,707,791 | 1/1998 | Ito et al. | 430/531 |
| 5,716,550 | 2/1998 | Gardner et al. | 252/500 |

FOREIGN PATENT DOCUMENTS

| | | |
|---|---|---|
| 250154 | 12/1987 | European Pat. Off. . |
| 301827 | 7/1993 | European Pat. Off. . |
| 4055492 | 4/1992 | Japan . |

*Primary Examiner*—Richard L. Schilling
*Attorney, Agent, or Firm*—Carl F. Ruoff; Doreen M. Wells

[57] ABSTRACT

The present invention is an imaging element which includes a support, an image-forming layer superposed on the support and an electrically-conductive layer superposed on the support. The electrically-conductive layer is composed of a sulfonated polyurethane film-forming binder and an electrically-conductive polymer.

19 Claims, No Drawings

ANTISTATIC LAYER WITH ELECTRICALLY CONDUCTING POLYMER FOR IMAGING ELEMENT

CROSS REFERENCE TO RELATED APPLICATIONS

This application relates to commonly assigned copending application Ser. No. 09/172,901, filed simultaneously herewith. This application relates to commonly assigned copending application Ser. No. 09/172,897, filed simultaneously herewith. This application relates to commonly assigned copending application Ser. No. 09/172,439, filed simultaneously herewith.

FIELD OF THE INVENTION

This invention relates in general to imaging elements, such as photographic, electrostatographic, and thermal imaging elements, and in particular to imaging elements comprising a support, an image forming layer and an electrically-conductive layer.

BACKGROUND OF THE INVENTION

The problem of controlling static charge is well known in the field of photography. The accumulation of charge on film or paper surfaces leads to the attraction of dirt which can produce physical defects. The discharge of accumulated charge during or after the application of the sensitized emulsion layer(s) can produce irregular fog patterns or "static marks" in the emulsion. The static problems have been aggravated by increases in the sensitivity of new emulsions, increases in coating machine speeds, and increases in post-coating drying efficiency. The charge generated during the coating process may accumulate during winding and unwinding operations, during transport through the coating machines and during finishing operations such as slitting and spooling. Static charge can also be generated during the use of the finished photographic film product. In an automatic camera, the winding of roll film in an out of the film cartridge, especially in a low relative humidity environment, can result in static charging. Similarly, high speed automated film processing can result in static charge generation. Sheet films (e.g., x-ray films) are especially susceptible to static charging during removal from light-tight packaging.

It is generally known that electrostatic charge can be dissipated effectively by incorporating one or more electrically-conductive "antistatic" layers into the film structure. Antistatic layers can be applied to one or to both sides of the film base as subbing layers either beneath or on the side opposite to the light-sensitive silver halide emulsion layers. An antistatic layer can alternatively be applied as an outermost layer either over the emulsion layers or on the side of the film base opposite to the emulsion layers or both. For some applications, the antistatic agent can be incorporated into the emulsion layers. Alternatively, the antistatic agent can be directly incorporated into the film base itself.

A wide variety of electrically-conductive materials can be incorporated into antistatic layers to produce a wide range of conductivity. These can be divided into two broad groups: (i) ionic conductors and (ii) electronic conductors. In ionic conductors charge is transferred by the bulk diffusion of charged species through an electrolyte. The resistivity of the antistatic layer is dependent on temperature and relative humidity for ionic conductors. Antistatic layers containing simple inorganic salts, alkali metal salts of surfactants, ionic conductive polymers, polymeric electrolytes containing alkali metal salts, and colloidal metal oxide sols (stabilized by metal salts), described previously in patent literature, are in this category. However, many of the inorganic salts, polymeric electrolytes, and low molecular weight surfactants used are water-soluble and are leached out of the antistatic layers during wet photographic processing, resulting in a loss of antistatic function. The conductivity of antistatic layers employing an electronic conductor depends on electronic mobility rather than ionic mobility and is independent of relative humidity. Antistatic layers which contain semiconductive metal halide salts, semiconductive metal oxide particles, etc., have been described previously. However, these antistatic layers typically contain a high volume percentage of electronically conducting materials which are often expensive and can impart unfavorable physical characteristics, such as color or reduced transparency, increased brittleness and poor adhesion, to the antistatic layer.

Colloidal metal oxide sols which exhibit ionic conductivity when included in antistatic layers are often used in imaging elements. Typically, alkali metal salts or anionic surfactants are used to stabilize these sols. A thin antistatic layer consisting of a gelled network of colloidal metal oxide particles (e.g., silica, antimony pentoxide, alumina, titania, stannic oxide, zirconia) with an optional polymeric binder to improve adhesion to both the support and overlying emulsion layers has been disclosed in EP 250,154. An optional ambifunctional silane or titanate coupling agent can be added to the gelled network to improve adhesion to overlying emulsion layers (e.g., EP 301,827 and U.S. Pat. No. 5,204,219) along with an optional alkali metal orthosilicate to minimize loss of conductivity by the gelled network when it is overcoated with gelatin-containing layers (U.S. Pat. No. 5,236,818). Also, it has been pointed out that coatings containing colloidal metal oxides (e.g., antimony pentoxide, alumina, tin oxide, indium oxide) and colloidal silica with an organopolysiloxane binder afford enhanced abrasion resistance as well as provide antistatic function (U.S. Pat. Nos. 4,442,168 and 4,571,365).

Antistatic layers containing electronic conductors such as conjugated conducting polymers, conducting carbon particles, crystalline semiconductor particles, amorphous semiconductive fibrils, and continuous semiconducting thin films can be used more effectively than ionic conductors to dissipate static charge since their electrical conductivity is independent of relative humidity and only slightly influenced by ambient temperature. Of the various types of electronic conductors, electrically conducting metal-containing particles, such as semiconducting metal oxides, are particularly effective when dispersed in suitable polymeric film-forming binders in combination with polymeric non-film-forming particles as described in U.S. Pat. Nos. 5,340,676; 5,466,567; 5,700,623. Binary metal oxides doped with appropriate donor heteroatoms or containing oxygen deficiencies have been disclosed in prior art to be useful in antistatic layers for photographic elements, for example, U.S. Pat. Nos. 4,275,103; 4,416,963; 4,495,276; 4,394,441; 4,418,141; 4,431,764; 4,495,276; 4,571,361; 4,999,276; 5,122,445; 5,294,525; 5,382,494; 5,459,021; 5,484,694 and others. Suitable claimed conductive metal oxides include: zinc oxide, titania, tin oxide, alumina, indium oxide, silica, magnesia, zirconia, barium oxide, molybdenum trioxide, tungsten trioxide, and vanadium pentoxide. Preferred doped conductive metal oxide granular particles include antimony-doped tin oxide, fluorine-doped tin oxide, aluminum-doped zinc oxide, and niobium-doped titania. Additional preferred conductive ternary metal oxides disclosed in U.S. Pat. No. 5,368,995 include zinc antimonate and indium antimonate. Other conductive metal-containing granular particles including metal borides, carbides, nitrides and silicides have been disclosed in Japanese Kokai No. JP 04-055,492.

One deficiency of such granular electronic conductor materials is that, especially in the case of semiconductive metal-containing particles, the particles usually are highly colored which render them unsuitable for use in coated layers on many photographic supports, particularly at high dry weight coverage. This deficiency can be overcome by using composite conductive particles consisting of a thin layer of conductive metal-containing particles deposited onto the surface of non-conducting transparent core particles whereby obtaining a lightly colored material with sufficient conductivity. For example, composite conductive particles consisting of two dimensional networks of fine antimony-doped tin oxide crystallites in association with amorphous silica deposited on the surface of much larger, non-conducting metal oxide particles (e.g., silica, titania, etc.) and a method for their preparation are disclosed in U.S. Pat. Nos. 5,350,448; 5,585,037 and 5,628,932. Alternatively, metal containing conductive materials, including composite conducting particles, with high aspect ratio can be used to obtain conductive layers with lighter color due to reduced dry weight coverage (vide, for example, U.S. Pat. Nos. 4,880,703 and 5,273,822). However, there is difficulty in the preparation of conductive layers containing composite conductive particles, especially composite particles having a high aspect ratio, since the dispersion of these particles in an aqueous vehicle using conventional wet milling dispersion techniques and traditional steel or ceramic milling media often results in wear or abrasion of the thin conducting layer from the core particle and/or reduction of the aspect ratio. Fragile composite conductive particles often cannot be dispersed effectively because of limitations on milling intensity and duration dictated by the need to minimize degradation of the morphology and electrical properties as well as the introduction of attrition-related contamination from the dispersion process.

More over, these metal containing semiconductive particles, can be quite abrasive and cause premature damage to finishing tools, such as, knives, slitters, perforators, etc. and create undesirable dirt and debris which can adhere to the imaging element causing defects.

The requirements for antistatic layers in silver halide photographic films are especially demanding because of the stringent optical requirements. Other types of imaging elements such as photographic papers and thermal imaging elements also frequently require the use of an antistatic layer. However, the requirements for such somewhat different. For example, for photographic paper, an additional criterion is the ability of the antistatic backing layer to receive printing (e.g., bar codes or other indicia containing useful information) typically administered by dot matrix or inkjet printers and to retain the printings or markings as the paper undergoes processing (viz., backmark retention). Yet another important criterion for photographic paper is acceptable spliceability. Heat splicing of photographic paper rolls is often carried out during printing operations and is required to provide sufficient mechanical strength to resist peeling as the web goes through automatic photographic processing. Heat splicing is typically carried out between the silver halide side of the paper and the antistatic backside of the paper. Poor splice strength can cause a number of problems including jamming of automatic processing equipment.

Electrically-conductive layers are also commonly used in imaging elements for purposes other than providing static protection. Thus, for example, in electrostatographic imaging it is well known to utilize imaging elements including a support, an electrically-conductive layer that serves as an electrode, and a photoconductive layer that serves as the image-forming layer. Electrically-conductive agents utilized as antistatic agents in photographic silver halide imaging elements are often also useful in the electrode layer of electrostatographic imaging elements.

As indicated above, the prior art on electrically-conductive layers in imaging elements is extensive and a very wide variety of different materials have been proposed for use as the electrically-conductive agent. There is still, however, a critical need in the art for improved electrically-conductive layers which are useful in a wide variety of imaging elements, which can be manufactured at reasonable cost, which are environmentally benign, which are durable and abrasion-resistant, which are effective at low coverage, which are adaptable to use with transparent imaging elements, which do not exhibit adverse sensitometric or photographic effects, and which maintain electrical conductivity even after coming in contact with processing solutions (since it has been observed in industry that loss of electrical conductivity after processing may increase dirt attraction to processed films which, when printed, may cause undesirable defects on the prints).

In addition to controlling static charging, auxiliary layers applied to photographic elements also provide many other functions. These include providing resistance to abrasion, curl, solvent attack, halation and providing reduced friction for transport. One additional feature that an auxiliary layer must provide when the layer serves as the outermost layer is resistance to the deposition of material onto the element upon photographic processing. Such deposited material can impact the physical performance of the element in a variety of ways. For example, large deposits of material on a photographic film lead to readily visible defects on photographic prints or are visible upon display of motion picture film. Alternatively, post-processing debris can influence the ability of a processed film to be overcoated with an ultra-violet curable abrasion resistant layer, as is done in professional photographic processing laboratories employing materials such as PhotoGard, 3M.

It is toward the objective of providing improved electrically-conductive layers that more effectively meet the diverse needs of imaging elements—especially of silver halide photographic films but also of a wide range of other imaging elements—than those of the prior art that the present invention is directed.

Electrically conducting polymers have recently received attention from various industries because of their electronic conductivity. Although many of these polymers are highly colored and are less suited for photographic applications, some of these electrically conducting polymers, such as substituted or unsubstituted pyrrole-containing polymers (as mentioned in U.S. Pat. Nos. 5,665,498 and 5,674,654), substituted or unsubstituted thiophene-containing polymers (as mentioned in U.S. Pat. Nos. 5,300,575; 5,312,681; 5,354,613; 5,370,981; 5,372,924; 5,391,472; 5,403,467; 5,443,944; 5,575,898; 4,987,042 and 4,731,408) and substituted or unsubstituted aniline-containing polymers (as mentioned in U.S. Pat. Nos. 5,716,550; 5,093,439 and 4,070,189) are transparent and not prohibitively colored, at least when coated in thin layers at moderate coverage. Because of their electronic conductivity instead of ionic conductivity, these polymers are conducting even at low humidity. Moreover, these polymers can retain sufficient conductivity even after wet chemical processing to provide what is known in the art as "process-surviving" antistatic characteristics to the photographic support they are applied. Unlike metal-containing semiconducting particulate antistatic materials (e.g., antimony-doped tin oxide), the aforementioned electrically conducting polymers are less abrasive, environmentally more acceptable (due to absence of heavy metals), and, in general, less expensive.

However, it has been reported (U.S. Pat. No. 5,354,613) that the mechanical strength of a thiophene-containing polymer layer is not sufficient and can be easily damaged without an overcoat. Protective layers such as poly(methyl methacrylate) can be applied on such thiophene-containing antistat layers but these protective layers typically are coated out of organic solvents and therefore not highly desired. More over, these protective layers may be too brittle to be an external layer for certain applications, such as motion picture print films (as illustrated in U.S. Pat. No. 5,679,505). Use of aqueous polymer dispersions (such as vinylidene chloride, styrene, acrylonitrile, alkyl acrylates and alkyl methacrylates) has been taught in U.S. Pat. No. 5,312,681 as an overlying barrier layer for thiophene-containing antistat layers, and onto the said overlying barrier layer is adhered a hydrophilic colloid-containing layer. However, the physical properties of these barrier layers may also preclude their use as an outermost layer in certain applications. The use of a thiophene-containing outermost antistat layer has been taught in U.S. Pat. No. 5,354,613 wherein a hydrophobic polymer with high glass transition temperature is incorporated in the antistat layer. But these hydrophobic polymers reportedly may require organic solvent(s) and/or swelling agent(s) "in an amount of at least 50% by weight" of the polythiophene, for coherence and film forming capability.

As will be demonstrated hereinbelow, the present invention provides an antistatic layer which can be a simple two component system comprising an electrically conducting polymer and a sulfonated polyurethane binder which provides certain advantages over prior art antistatic layers including humidity-independent antistatic properties as well as the retention of antistatic properties after color photographic processing.

SUMMARY OF THE INVENTION

The present invention is an imaging element which includes a support, an image-forming layer superposed on the support and an electrically-conductive layer superposed on the support. The electrically-conductive layer is composed of a sulfonated polyurethane film-forming binder and an electrically-conductive polymer.

DETAILED DESCRIPTION OF THE INVENTION

The antistatic layer of the present invention comprises an electrically conducting polymer as component A and a sulfonated polyurethane binder as component B. Such an antistatic layer provides an electrical resistivity of less than 12 log ohms/square in an ambient of 50%–5% relative humidity, but preferably less than 11 log ohms/square. Additionally, such an antistatic layer provides adequate electrical resistivity values of less than 12 log ohms/square, preferably less than 11 log ohms/square, more preferably less than 10 log ohms/square, after undergoing typical color photographic film processing.

The imaging elements of this invention can be of many different types depending on the particular use for which they are intended. Such elements include, for example, photographic, electrostatographic, photothermographic, migration, electrothermographic, dielectric recording and thermal-dye-transfer imaging elements.

Photographic elements which can be provided with an antistatic layer in accordance with this invention can differ widely in structure and composition. For example, they can vary greatly in regard to the type of support, the number and composition of the image-forming layers, and the kinds of auxiliary layers that are included in the elements. In particular, the photographic elements can be still films, motion picture films, x-ray films, graphic arts films, paper prints or microfiche. They can be black-and-white elements, color elements adapted for use in a negative-positive process, or color elements adapted for use in a reversal process.

Photographic elements can include any of a wide variety of supports. Typical supports include cellulose nitrate film, cellulose acetate film, poly(vinyl acetal) film, polystyrene film, poly(ethylene terephthalate) film, poly(ethylene naphthalate) film, polycarbonate film, glass, metal, paper, polymer-coated paper, and the like. The image-forming layer or layers of the element typically have a radiation-sensitive agent, e.g., silver halide, dispersed in a hydrophilic water-permeable colloid. Suitable hydrophilic vehicles include both naturally-occurring substances such as proteins, for example, gelatin, gelatin derivatives, cellulose derivatives, polysaccharides such as dextran, gum arabic, and the like, and synthetic polymeric substances such as water-soluble polyvinyl compounds like poly (vinylpyrrolidone), acrylamide polymers, and the like. A particularly common example of an image-forming layer is a gelatin-silver halide emulsion layer.

Further details with respect to the composition and function of a wide variety of different imaging elements are provided in U.S. Pat. No. 5,300,676 and references described therein which are incorporated herein by reference. All of the imaging processes described in the '676 patent, as well as many others, have in common the use of an electrically-conductive layer as an electrode or as an antistatic layer. The requirements for a useful electrically-conductive layer in an imaging environment are extremely demanding and thus the art has long sought to develop improved electrically-conductive layers exhibiting the necessary combination of physical, optical and chemical properties.

The antistatic coating compositions of the invention can be applied to the aforementioned film or paper supports by any of a variety of well-known coating methods. Handcoating techniques include using a coating rod or knife or a doctor blade. Machine coating methods include skim pan/air knife coating, roller coating, gravure coating, curtain coating, bead coating or slide coating. Alternatively, the antistatic layer or layers of the present invention can be applied to a single or multilayered polymeric web by any of the aforementioned methods, and the polymeric web can subsequently be laminated (either directly or after stretching) to a film or paper support of an imaging element (such as those discussed above) by extrusion, calendering or any other suitable method.

The antistatic layer or layers of the present invention can be applied to the support in various configurations depending upon the requirements of the specific application. In the case of photographic elements, an antistatic layer can be applied to a polyester film base during the support manufacturing process after orientation of the cast resin on top of a polymeric undercoat layer. The antistatic layer can be applied as a subbing layer under the sensitized emulsion, on the side of the support opposite the emulsion or on both sides of the support. Alternatively, it can be applied over the emulsion or between emulsion layers on either or both sides of the support. When the antistatic layer is applied as a subbing layer under the sensitized emulsion, it is not necessary to apply any intermediate layers such as barrier layers or adhesion promoting layers between it and the sensitized emulsion, although they can optionally be present. Alternatively, the antistatic layer can be applied as part of a multi-component curl control layer on the side of the support opposite to the sensitized emulsion. The antistatic layer is typically located closest to the support. An intermediate layer, containing primarily binder and antihalation dyes functions as an antihalation layer. The outermost layer containing binder, matte, and surfactants functions as a protective overcoat.

The antistatic layer may be used in a single or multilayer backing layer which is applied to the side of the support opposite to the sensitized emulsion. Such backing layers, which typically provide friction control and scratch, abrasion, and blocking resistance to imaging elements are commonly used, for example, in films for consumer imaging, motion picture imaging, business imaging, and others. In the case of backing layer applications, the antistatic layer can optionally be overcoated with a polyurethane or other polymeric topcoat with appropriate physical properties (as described in U.S. Pat. No. 5,679,505) and/or an alkali- removable carbon black-containing layer (as described in U.S. Pat. Nos. 2,271,234 and 2,327,828) and/or any other layer(s) for other functions.

In the case of photographic elements for direct or indirect x-ray applications, the antistatic layer can be applied as a subbing layer on either side or both sides of the film support. In one type of photographic element, the antistatic subbing layer is applied to only one side of the film support and the sensitized emulsion coated on both sides of the film support. Another type of photographic element contains a sensitized emulsion on only one side of the support and a pelloid containing gelatin on the opposite side of the support. An antistatic layer can be applied under the sensitized emulsion or, preferably, the pelloid. Additional optional layers can be present. In another photographic element for x-ray applications, an antistatic subbing layer can be applied either under or over a gelatin subbing layer containing an antihalation dye or pigment. Alternatively, both antihalation and antistatic functions can be combined in a single layer containing conductive particles, antihalation dye, and a binder. This hybrid layer can be coated on one side of a film support under the sensitized emulsion.

It is also contemplated that the electrically-conductive layer described herein can be used in imaging elements in which a relatively transparent layer containing magnetic particles dispersed in a binder is included. The electrically-conductive layer of this invention functions well in such a combination and gives excellent photographic results. Transparent magnetic layers are well known and are described, for example, in U.S. Pat. No. 4,990,276, European Patent 459,349, and Research Disclosure, Item 34390, November, 1992, the disclosures of which are incorporated herein by reference. As disclosed in these publications, the magnetic particles can be of any type available such as ferro- and ferri-magnetic oxides, complex oxides with other metals, ferrites, etc. and can assume known particulate shapes and sizes, may contain dopants, and may exhibit the pH values known in the art. The particles may be shell coated and may be applied over the range of typical laydown.

Imaging elements incorporating conductive layers of this invention that are useful for other specific applications such as color negative films, color reversal films, black-and-white films, color and black-and-white papers, electrophotographic media, thermal dye transfer recording media etc., can also be prepared by the procedures described hereinabove. Other addenda, such as polymer latices to improve dimensional stability, hardeners or crosslinking agents, and various other conventional additives can be present optionally in any or all of the layers of the various aforementioned imaging elements. The antistatic layer of the present invention comprises an electrically-conducting polymer, specifically an electronically-conducting polymer, as component A and a sulfonated polyurethane binder as component B, and can be coated out of an aqueous system on a suitable imaging element. Component A can be chosen from any or a combination of electrically-conducting polymers, such as substituted or unsubstituted pyrrole-containing polymers (as mentioned in U.S. Pat. Nos. 5,665,498 and 5,674,654), substituted or unsubstituted thiophene-containing polymers (as mentioned in U.S. Pat. Nos. 5,300,575; 5,312,681; 5,354,613; 5,370,981; 5,372,924; 5,391,472; 5,403,467; 5,443,944; 5,575,898; 4,987,042 and 4,731,408) and substituted or unsubstituted aniline-containing polymers (as mentioned in U.S. Pat. Nos. 5,716,550; 5,093,439 and 4,070, 189). The electrically conducting polymer may be soluble or dispersible in organic solvents or water or mixtures thereof. For environmental reasons, aqueous systems are preferred. Polyanions used in the synthesis of these electrically conducting polymers are the anions of polymeric carboxylic acids such as polyacrylic acids, polymethacrylic acids or polymaleic acids and polymeric sulfonic acids such as polystyrenesulfonic acids and polyvinylsulfonic acids, the polymeric sulfonic acids being those preferred for this invention. These polycarboxylic and polysulfonic acids may also be copolymers of vinylcarboxylic and vinylsulfonic acids with other polymerizable monomers such as the esters of acrylic acid and styrene. The molecular weight of the polyacids providing the polyanions preferably is 1,000 to 2,000,000, particularly preferably 2,000 to 500,000. The polyacids or their alkali salts are commonly available, e.g., polystyrenesulfonic acids and polyacrylic acids, or they may be produced based on known methods. Instead of the free acids required for the formation of the electrically conducting polymers and polyanions, mixtures of alkali salts of polyacids and appropriate amounts of monoacids may also be used. Preferred electrically conducting polymers for the present invention include polypyrrole styrene sulfonate (referred to as polypyrrole/poly (styrene sulfonic acid) in U.S. Pat. No. 5,674,654), 3,4-dialkoxy substituted polypyrrole styrene sulfonate, and 3,4-dialkoxy substituted polythiophene styrene sulfonate. The most preferred substituted electrically conductive polymers include poly(3,4-ethylene dioxypyrrole styrene sulfonate) and poly(3,4-ethylene dioxythiophene styrene sulfonate).

Component B is a sulfonated polyurethane, preferably, an aqueous-dispersible anionic aliphatic polyurethane.

The preparation of polyurethanes in general and, water-dispersible polyurethanes in particular, is well known and described, for example, in U.S. Pat. Nos. 4,307,219, 4,408, 008, and 3,998,870. Water-dispersible polyurethanes are prepared by chain extending a prepolymer containing terminal isocyanate groups with a chain extension agent (an active hydrogen compound, usually a diamine or diol). The prepolymer is formed by reacting a diol or polyol having terminal hydroxyl groups with excess diisocyanate or polyisocyanate. To permit dispersion in water, water-solubilizing/dispersing groups are introduced either into the prepolymer prior to chain extension or are introduced as part of the chain extension agent. For the purpose of the present invention, the polyurethane contains sulfonate groups as the water-solubilizing/dispersing groups. The polyurethane may also contain a combination of sulfonate groups and nonionic groups such as pendant polyethylene oxide chains as the water-solubilizing/dispersing groups. The sulfonate groups may be introduced by utilizing sulfonate-containing diols or polyols, sulfonate-containing-diisocyanates or polyisocyanates or sulfonate-containing-chain extension agents such as a sulfonate-containing diamines in the preparation of the water-dispersible polyurethane.

Use of sulfonated polyesters in conjunction with polythiophene in antistatic primers has been disclosed in U.S. Pat. No. 5,391,472. Use of sulfonated polyesters in conjunction with polypyrrole has been disclosed in U.S. Pat. Nos. 5,674,654 and 5,665,498. However, demonstrated hereinbelow through comparative samples, such sulfonated polyesters resulted in inferior performance when compared to sulfonated polyurethanes, as per the current invention. Use of polyurethanes with hydrophilic properties, as a third component in antistatic primers containing polythiophene and sulfonated polyesters, has been additionally disclosed in U.S. Pat. No. 5,391,472. However, as demonstrated hereinbelow through comparative samples, not all polyurethanes with hydrophilic properties are compatible with electrically-conducting polymers. In fact, the coating of a polythiophene-containing layer with a polyurethane binder and magnetic particles resulted in "insufficient antistatic effects", according to the disclosure of U.S. Pat. No. 5,443,944. U.S. Pat. No. 5,707,791 claims a silver halide material having a resin layer consisting of an antistatic agent and an aqueous-dispersible polyester resin or an aqueous-dispersible polyurethane resin, and a magnetic layer coated on the resin layer. The antistatic agent is selected from the group consisting of a conductive polymer and a metal oxide. Methods of making the polyurethane water dispersible are indicated to include introducing a carboxyl group, sulfonate group or tertiary amino group into the polyurethane. However, the conductive polymers indicated in U.S. Pat. No. 5,707,791 are ionically-conducting polymers. Electronically-conducting polymers such as those containing polythiophenes, polyanilines and polypyrroles are not included in U.S. Pat. No. 5,707,791. Thus, the results obtained, in accordance with the present invention in a two component system with component A being an electronically conducting polymer and component B being a sulfonated polyurethane are neither expected from nor anticipated by the disclosures of U.S. Pat. Nos. 5,391,472; 5,443,944; 5,674,654; 5,665,498 and 5,707,791.

The relative amount of the electrically-conducting polymer (component A) can vary from 1–99 weight % and the relative amount of the sulfonated polyurethane binder (component B) can vary from 99–1 weight % in the dried layer. In a preferred embodiment of this invention the amount of electrically-conducting polymer is between 10 and 70 weight % and the sulfonated polyurethane binder is between 90 and 30 weight % of the dried layer. In another embodiment of the present invention, a third polymeric component may be incorporated in the antistat layer for improved dispersion quality (of the electrically conducting polymer), electrical conductivity and physical properties wherein this third component may contain a sulfonated polystyrene and/or a copolymer of sulfonated styrene-maleic anhydride and/or a polyester ionomer or the like known in the art for their aforementioned properties. The relative amount of this third component may vary from 0 and 30 weight % but preferably between 5 and 20 weight % of the dried layer. The coating composition is coated at a dry weight coverage of between 5 mg/m$^2$ and 10,000 mg/m$^2$, e.g., between 10 mg/m$^2$ and 10,000 mg/m$^2$, but preferably between 100–2000 mg/m$^2$.

In addition to binders and solvents, other components that are well known in the photographic art may also be present in the electrically-conductive layer. These additional components include: surfactants and coating aids, charge control agents, thickeners, coalescing aids, crosslinking agents or hardeners, soluble and/or solid particle dyes, antifoggants, matte beads, lubricants, and other addenda that are well-known in the art.

The present invention is further illustrated by the following examples of its practice.

Sample Preparation

Electrically conducting polymer (component A) dispersion

The electrically conducting polymer (component A) in the following samples is either a polypyrrole or a polythiophene derivative. The conducting polypyrrole is derived from a an aqueous dispersion of polypyrrole/poly(styrene sulfonic acid) prepared by oxidative polymerization of pyrrole in aqueous solution in the presence of poly(styrene sulfonic acid) using ammonium persulfate as the oxidant, following U.S. Pat. No. 5,674,654, incorporated by reference herein. This electrically conducting polymer is henceforth referred to as polypyrrole.

The electrically conducting polythiophene is derived from an aqueous dispersion of a commercially available thiophene-containing polymer supplied by Bayer Corporation as Baytron P. This electrically conducting polymer in based on an ethylene dioxythiophene henceforth referred to as polythiophene.

Sulfonated polyurethane (component B) dispersion

A commercially available sulfonated polyurethane aqueous dispersion, Bayhydrol PR 240 from Bayer Corporation, was used.

Film base

Polyester film bases, either poly(ethylene terephthalate) (or PET) film or poly(ethylene naphthalate) (or PEN) film, that had been previously coated with a subbing layer of vinylidene chloride-acrylonitrile-acrylic acid terpolymer latex was used as the support on which aqueous coatings were applied using a coating hopper. The coatings were dried between 80° C. and 125° C. The coating coverage varied between 300 mg/m$^2$ and 1000 mg/m$^2$ when dried. Some of these coatings were overcoated with an aqueous polyurethane dispersion, Witcobond W-232 from Witco Corporation.

Test Methods

For resistivity tests, samples were preconditioned at 50% RH 23° F. for at least 24 hours prior to testing. Surface electrical resistivity (SER) was measured with a Kiethley Model 616 digital electrometer using a two point DC probe by a method similar to that described in U.S. Pat. No. 2,801,191. Internal resistivity or "water electrode resistivity" (WER) was measured by the procedures described in R. A. Elder, "Resistivity Measurements on Buried Conductive Layers", EOS/ESD Symposium proceedings, September 1990, pages 251–254.

Dry adhesion was evaluated by scribing a small cross-hatched region into the coating with a razor blade. A piece of high-tack adhesive tape was placed over the scribed region and quickly removed. The relative amount of coating removed is a qualitative measure of the dry adhesion. No removal of coating indicates excellent dry adhesion.

Working Examples

Samples 1–12 were coated, as per the present invention, on subbed PET support. All these samples resulted in excellent dry adhesion of the coated layer to the subbed polyester support, with no removal of coating per the dry adhesion test. The following table provides the details about the composition and nominal dry coverage of these samples and the corresponding SER values measured at 50% RH. Clearly, all these samples have good electrical conductivity, demonstrating the effectiveness of the present invention as an external antistat layer.

| Sample | Component A electrically conducting polypyrrole dry wt. % | Component B sulfonated polyurethane dry wt. % | Coverage g/m$^2$ | SER log ohm/square 50% RH before processing |
|---|---|---|---|---|
| 1 | 15 | 85 | 0.3 | 9.2 |
| 2 | 15 | 85 | 0.6 | 8.7 |
| 3 | 15 | 85 | 1.0 | 8.5 |
| 4 | 20 | 80 | 0.3 | 8.5 |
| 5 | 20 | 80 | 0.6 | 8.2 |
| 6 | 20 | 80 | 1.0 | 8.1 |
| 7 | 25 | 75 | 0.3 | 8.2 |
| 8 | 25 | 75 | 0.6 | 7.7 |
| 9 | 25 | 75 | 1.0 | 7.7 |
| 10 | 30 | 70 | 0.3 | 7.8 |
| 11 | 30 | 70 | 0.6 | 7.7 |
| 12 | 30 | 70 | 1.0 | 7.4 |

The SER values of some of these samples were measured at low relative humidity, as shown in the following table. Clearly, these samples have excellent SER values even at 5% relative humidity consistent with electronic conductivity.

| Sample | SER log ohm/square 20% RH | SER log ohm/square 5% RH |
|---|---|---|
| 4 | 8.1 | 8 |
| 5 | 7.6 | 7.6 |
| 10 | 7.3 | 7.3 |
| 11 | 7 | 7 |

Samples, 4–6, were subjected to C-41 color photographic processing. The SER values at 50% RH for these samples were measured before and after processing. As shown in the following table, these samples clearly retain good conductivity after color processing, to be effective as "process-surviving" external antistat layers.

| Sample | Component A electrically conducting polypyrrole dry wt. % | Component B sulfonated polyurethane dry wt. % | Coverage g/m$^2$ | SER log ohm/square 50% RH before processing | SER log ohm/square 50% RH after C-41 processing |
|---|---|---|---|---|---|
| 4 | 20 | 80 | 0.3 | 8.5 | 9.9 |
| 5 | 20 | 80 | 0.6 | 8.2 | 9.6 |
| 6 | 20 | 80 | 1.0 | 8.1 | 9.1 |

Comparative Samples

Comparative samples, Comp. 1–3, were coated on subbed PET support, using a commercially available sulfonated polyester ionomer, AQ55D from Eastman Chemicals, as component B, in accordance with the disclosures of U.S. Pat. Nos. 5,391,472; 5,674,654 and 5,665,498. The details of these comparative samples and the corresponding SER values, before and after C-41 processing, are listed in the following table. When compared with samples 4–6, prepared similarly but with sulfonated polyurethane (in accordance with the present invention), it is clear that the present invention provides superior SER values, both before and after C-41 processing.

| Sample | Component A electrically conducting polypyrrole dry wt. % | Component B sulfonated polyester ionomer dry wt. % | Coverage g/m$^2$ | SER log ohm/square 50% RH before processing | SER log ohm/square 50% RH after C-41 processing |
|---|---|---|---|---|---|
| Comp.1 | 20 | 80 | 0.3 | 9.6 | 12.2 |
| Comp.2 | 20 | 80 | 0.6 | 9 | 11.2 |
| Comp.3 | 20 | 80 | 1.0 | 9 | 11 |

Comparative Samples

An aqueous dispersion of polypyrrole (component A) was mixed with an aqueous dispersion of a non-sulfonated polyurethane, Bayhydrol 123 from Bayer Corporation, in a 20:80 weight ratio. This resulted in coagulation of the mixture, rendering it unsuitable for coating, indicating the incompatibility of a non-sulfonated polyurethane with the electrically-conducting polypyrrole. Note that this polyurethane dispersion contains neutralized, carboxylic acid groups as the polyurethane solubilizing/dispersing groups, as recommended by U.S. Pat. No. 5,391,472 but are not sulfonated, as taught by the present invention. Similar results were obtained when an aqueous dispersion of polypyrrole (component A) was mixed with an aqueous dispersion of any of the non-sulfonated polyurethanes, Witcobond W-160, Witcobond W-213, Witcobond W-236 and Witcobond W-320, all from Witco Corporation, in a 20:80 weight ratio.

Working Examples

Samples 13–16 were coated on subbed PET, in accordance with the present invention, comprising three components where Component A is the electrically conducting polypyrrole, component B is the sulfonated polyurethane PR240 from Bayer Corporation and component C is a commercially available copolymer of sulfonated styrene-maleic anhydride Versa TL 3 from National Starch and Chemical Company. All these samples had excellent dry adhesion. The following table provides the details about the composition and nominal dry coverage of these samples and the corresponding SER values before and after C-41 processing. Clearly, these samples prepared in accordance with the present invention maintain good SER values before and after C-41 processing to provide "process-surviving" antistatic characteristics.

The SER values of unprocessed samples 13 and 14 were measured at different RH values and are listed in the following table. Clearly, the samples prepared as per the present invention, with three components, also maintain excellent SER values even at very low RH (6.4%).

| Sample | SER log ohm/square 50% RH | SER log ohm/square 20% RH | SER log ohm/square 6.4% RH |
|---|---|---|---|
| 13 | 8 | 7.6 | 7.5 |
| 14 | 7.7 | 7.3 | 7.2 |

Working Examples

Samples 17–21 were coated on subbed PET with the same composition as Samples 4, 10, 11, 13, and 14, respectively, but were additionally overcoated with 1.0 g/m$^2$ of a polyurethane, Witcobond W-232 from Witco Corporation. The polyurethane overcoat also comprised 5% by weight of an aziridine cross-linker. Note that this polyurethane, Witcobond W-232, fulfills the criteria for a protective topcoat useful for motion picture print film backings, as specified in U.S. Pat. No. 5,679,505. The details of samples 17–22 together with the corresponding WER values, before and after C-41 processing, are listed in the following table. Clearly, the antistat subbing layer overcoated with a polyurethane topcoat, in accordance with the present invention, has excellent WER values before and after color processing. This demonstrates the suitability of the present invention for motion picture applications, providing "process-surviving" antistatic characteristics.

| Sample | Component A electrically conducting polypyrrole dry wt. % | Component B sulfonated polyurethane dry wt. % | Component C copolymer of sulfonated styrene-maleic anhydride dry wt. % | Coverage g/m$^2$ | SER log ohm/square 50% RH before processing | SER log ohm/square 50% RH after C-41 processing |
|---|---|---|---|---|---|---|
| 13 | 30 | 55 | 15 | 0.3 | 8 | 9.1 |
| 14 | 30 | 55 | 15 | 0.6 | 7.7 | 8.3 |
| 15 | 40 | 40 | 20 | 0.3 | 7.6 | 8.4 |
| 16 | 40 | 40 | 20 | 0.6 | 7.3 | 7.8 |

| Sample | Composition and coverage of subbed antistat layer | Composition of overcoat | Coverage of overcoat g/m$^2$ | WER log ohm/square before processing | WER log ohm/square after C-41 processing |
|---|---|---|---|---|---|
| 17 | Same as sample 4 | Cross-linked polyurethane | 1.0 | 8.8 | 9.1 |
| 18 | Same as sample 10 | Cross-linked polyurethane | 1.0 | 8 | 8.1 |
| 19 | Same as sample 11 | Cross-linked polyurethane | 1.0 | 7.8 | 7.8 |
| 20 | Same as sample 13 | Cross-linked polyurethane | 1.0 | 7.9 | 8.1 |
| 21 | Same as sample 14 | Cross-linked polyurethane | 1.0 | 7.4 | 8.1 |

Working Examples

Samples 22–26 were coated, as per the present invention, on subbed PEN support rather than PET support. Samples 22–25 were coated with the same composition as Samples 4, 5, 10 and 11, respectively. Sample 26 is similar to sample 13 except Component C is a sulfonated polyester ionomer AQ55D, commercially available from Eastman Chemicals. Samples 22–26 had excellent dry adhesion. The following table provides the details about the composition and nominal dry coverage of these samples and the corresponding SER values measured at 50% RH before and after C-41 processing. Clearly, these samples prepared in accordance with the present invention have good SER values before and after C-41 processing, providing "process-surviving" antistatic characteristics.

| Sample | Component A electrically conducting polypyrrole dry wt. % | Component B sulfonated polyurethane dry wt. % | Component C sulfonated polyester dry wt. % | Coverage g/m$^2$ | SER log ohm/square 50% RH before processing | SER log ohm/square 50% RH after C-41 processing |
|---|---|---|---|---|---|---|
| 22 | 20 | 80 | — | 0.3 | 8.4 | 9.7 |
| 23 | 20 | 80 | — | 0.6 | 8.2 | 9.2 |
| 24 | 30 | 70 | — | 0.3 | 7.8 | 9.4 |
| 25 | 30 | 70 | — | 0.6 | 8.0 | 8.9 |
| 26 | 30 | 55 | 15 | 0.3 | 7.8 | 9.2 |

Working Examples

Samples 27–32 were coated on subbed PET support as per the present invention using polythiophene as component A. All these samples resulted in excellent dry adhesion of the coated layer to the subbed polyester support. The following table provides the details about the composition and nominal dry coverage of these samples and the corresponding SER values measured at 50% RH before and after C-41 processing. Clearly, these samples prepared in accordance with the present invention have good SER values before and after C-41 processing, providing process surviving antistatic characteristic.

| Sample | Component A electrically conducting polythiophene dry wt. % | Component B sulfonated polyurethane dry wt. % | Coverage g/m$^2$ | SER log ohm/square 50% RH before processing | SER log ohm/sqaure 50% RH after C-41 processing |
|---|---|---|---|---|---|
| 27 | 10 | 90 | 0.15 | 9 | 10 |
| 28 | 10 | 90 | 0.3 | 8.6 | 9.7 |
| 29 | 10 | 90 | 0.6 | 8.3 | 9.2 |
| 30 | 20 | 80 | 0.15 | 8.2 | 9.2 |
| 31 | 20 | 80 | 0.3 | 8.1 | 9.2 |
| 32 | 20 | 80 | 0.6 | 7.6 | 8.6 |

The SER value of sample 28 was measured at low relative humidity, as shown in the following table. Clearly, the sample provides excellent SER value even at 5% relative humidity, consistent with electronic conductivity of polythiophene, demonstrating again that the samples prepared as per the present invention, can provide static protection under a wide range of relative humidity.

| Sample | SER log ohm/square 20% RH | SER log ohm/square 5% RH |
|---|---|---|
| 28 | 7.6 | 7.5 |

The invention has been described in detail with particular reference to certain preferred embodiments thereof, but it will be understood that variations and modifications can be effected within the spirit and scope of the invention.

What is claimed is:

1. An imaging element comprising a support;
   at least one image-forming layer superposed on the support; and
   at least one electrically-conductive layer superposed on the support;
   said electrically-conductive layer comprising a sulfonated polyurethane film-forming binder and an electrically-conductive polymer;
   wherein the electrically-conducting polymer comprises substituted pyrrole-containing polymers, unsubstituted pyrrole-containing polymers, substituted thiophene-containing polymers, unsubstituted thiophene-containing polymers, substituted aniline-containing polymers or unsubstituted aniline-containing polymers.

2. The imaging element of claim 1 wherein the support is selected from the group consisting of cellulose nitrate film, cellulose acetate film, poly(vinyl acetal) film, polystyrene film, poly(ethylene terephthalate) film, poly(ethylene naphthalate) film, polycarbonate film, glass, metal and paper.

3. An imaging element according to claim 1, wherein said electrically-conductive layer is superposed on the support between the support and an image-forming layer, superposed on the side of said support opposite an imaging-forming layer, or both.

4. The imaging element of claim 1, wherein the electrically-conducting layer further comprises as a further component a polymer selected from the group consisting of sulfonated polystyrenes, sulfonated styrene-maleic anhydrides and polyester ionomers.

5. The imaging element of claim 1, wherein the electrically-conducting layer further comprises surfactants, coating aids, charge control agents, thickeners, coalescing aids, crosslinking agents, particle dyes, antifoggants, matte beads or lubricants.

6. The imaging element of claim 1, wherein the amount of the electrically-conducting polymer in the dried electrically conducting layer is 0.1–99 weight %.

7. The imaging element of claim 1, wherein the amount of the sulfonated film-forming polyurethane binder in the dried electrically-conducting layer is 1–99.9 weight %.

8. The imaging element of claim 1 wherein the electrically-conducting layer comprises a dry weight coverage of between 5 mg/m$^2$ and 10,000 mg/m$^2$.

9. The imaging element of claim 1, wherein the sulfonated polyurethane film-forming binder comprises an anionic aliphatic aqueous-dispersible polyurethane.

10. A photographic element comprising:

a support;

at least one silver halide image-forming layer superposed on the support; and at least one electrically-conductive layer superposed on the support;

said electrically-conductive layer comprising a sulfonated polyurethane film-forming binder and an electrically-conductive polymer;

wherein the electrically-conducting polymer comprises substituted pyrrole-containing polymers, unsubstituted pyrrole-containing polymers, substituted thiophene-containing polymers, unsubstituted thiophene-containing polymers, substituted aniline-containing polymers or unsubstituted aniline-containing polymers.

11. An imaging element comprising:

a support;

at least one image-forming layer superposed on the support; and at least one electrically-conductive layer superposed on the support; said electrically-conductive layer comprising a sulfonated polyurethane film-forming binder and polypyrrole styrene sulfonate or 3,4-dialkoxy substituted polypyrrole styrene sulfonate.

12. An imaging element comprising:

a support;

at least one image-forming layer superposed on the support; and at least one electrically-conductive layer superposed on the support; said electrically-conductive layer comprising a sulfonated polyurethane film-forming binder and 3,4-dialkoxy substituted polythiophene styrene sulfonate.

13. An imaging element according to claim 11, wherein said support is selected from cellulose nitrate film, cellulose acetate film, poly(vinyl acetal) film, polystyrene film, poly(ethylene terephthalate) film, poly(ethylene naphthalate) film, polycarbonate film, glass, metal and paper.

14. An imaging element according to claim 11, wherein said electrically-conductive layer contains poly(3,4-ethylene dioxypyrrole styrene sulfonate).

15. An imaging element according to claim 12, wherein said support is selected from the group consisting of cellulose nitrate film, cellulose acetate film, poly(vinyl acetal) film, polystyrene film, poly(ethylene terephthalate) film, poly(ethylene naphthalate) film, polycarbonate film, glass, metal and paper.

16. An imaging element according to claim 12, wherein said electrical-conductive layer contains poly(3,4-ethylene dioxythiophene styrene sulfonate).

17. An imaging element according to claim 4, wherein the amount of said further component is 5–20 wt % of the dried electrically-conductive layer.

18. An imaging element according to claim 1, wherein the amount of electrically-conductive polymer in the dried electrically-conductive layer is 1–99 wt %, and the amount of sulfonated film-forming polyurethane binder in the dried electrically-conductive layer is 1–99.9 wt %, and wherein the dried electrically-conductive layer optionally contains a further component in an amount of 0–30 wt %, said further component being selected from the group consisting of sulfonated polystyrenes, sulfonated styrene-maleic anhydrides and polyester ionomers.

19. An imaging element according to claim 1, wherein the amount of electrically-conductive polymer in the dried electrically-conductive layer is 10–70 wt %, and the amount of sulfonated film-forming polyurethane binder in the dried electrically-conductive layer is 30–90 wt %.

* * * * *